US010268088B2

(12) United States Patent
Takeda et al.

(10) Patent No.: US 10,268,088 B2
(45) Date of Patent: Apr. 23, 2019

(54) DISPLAY DEVICE

(71) Applicant: Japan Display Inc., Minato-ku (JP)

(72) Inventors: Arihiro Takeda, Tokyo (JP); Keiji Tago, Tokyo (JP); Kayoko Miyazaki, Tokyo (JP); Ayumi Mori, Tokyo (JP)

(73) Assignee: JAPAN DISPLAY INC., Minato-ku (JP)

( * ) Notice: Subject to any disclaimer, the term of this patent is extended or adjusted under 35 U.S.C. 154(b) by 0 days.

(21) Appl. No.: 15/637,591

(22) Filed: Jun. 29, 2017

(65) Prior Publication Data

US 2017/0299926 A1    Oct. 19, 2017

Related U.S. Application Data

(63) Continuation of application No. 14/516,858, filed on Oct. 17, 2014, now Pat. No. 9,733,527.

(30) Foreign Application Priority Data

Oct. 18, 2013 (JP) ................................. 2013-217441

(51) Int. Cl.
*G02F 1/1343* (2006.01)
*G02F 1/1337* (2006.01)
(Continued)

(52) U.S. Cl.
CPC ...... *G02F 1/134309* (2013.01); *G02F 1/1368* (2013.01); *G02F 1/133345* (2013.01);
(Continued)

(58) Field of Classification Search
CPC .......... G02F 1/133514; G02F 2201/52; G02F 2001/136222; G02F 1/136286;
(Continued)

(56) References Cited

U.S. PATENT DOCUMENTS 6,888,604 B2    5/2005   Rho et al.
6,989,876 B2    1/2006   Song et al.
(Continued)

FOREIGN PATENT DOCUMENTS

JP    10-123501 A    5/1998
JP    2004-4822      1/2004
(Continued)

OTHER PUBLICATIONS

Office Action issued in Japanese Patent Application No. 2013-217441 dated Jul. 4, 2017 with English Translation.
(Continued)

*Primary Examiner* — Jia Pan
(74) *Attorney, Agent, or Firm* — Oblon, McClelland, Maier & Neustadt, L.L.P.

(57) ABSTRACT

A display device includes a first color pixel, a second color pixel neighboring the first color pixel in a first direction, a third color pixel neighboring the second color pixel in the first direction, a fourth color pixel neighboring the first color pixel in a second direction, a fifth color pixel neighboring the second color pixel in the second direction, and a sixth color pixel neighboring the third color pixel in the second direction, wherein each of the first color pixel, the second color pixel, the fourth color pixel and the fifth color pixel has a first long-side length, the third color pixel has a second long-side length which is greater than the first long-side length, and the sixth color pixel has a third long-side length which is less than the first long-side length.

3 Claims, 9 Drawing Sheets

(51) Int. Cl.
  *G02F 1/1335* (2006.01)
  *G02F 1/1362* (2006.01)
  *G02F 1/1333* (2006.01)
  *G02F 1/1368* (2006.01)
  *H01L 27/32* (2006.01)

(52) U.S. Cl.
  CPC .. *G02F 1/133512* (2013.01); *G02F 1/133514* (2013.01); *G02F 1/133707* (2013.01); *G02F 1/134336* (2013.01); *G02F 1/136286* (2013.01); *G02F 2201/121* (2013.01); *G02F 2201/123* (2013.01); *G02F 2201/52* (2013.01); *H01L 27/3213* (2013.01)

(58) Field of Classification Search
  CPC ......... G02F 1/133707; G02F 1/136209; G02F 1/133512; G09G 3/2003; G09G 2300/0452; G09G 3/3607; G09G 3/3611; G09G 5/02; G02B 5/201; H01L 27/322; H01L 27/3213
  See application file for complete search history.

(56) References Cited

U.S. PATENT DOCUMENTS

| | | | |
|---|---|---|---|
| 8,355,104 B2 | 1/2013 | Yoshida | |
| 2006/0262251 A1 | 11/2006 | Kim | |
| 2008/0049048 A1 | 2/2008 | Credelle | |
| 2008/0180624 A1 | 7/2008 | Choi et al. | |
| 2008/0218645 A1 | 9/2008 | Zhu | |
| 2009/0109358 A1* | 4/2009 | Tanaka | G02F 1/134363 349/38 |
| 2010/0007833 A1 | 1/2010 | Kuo | |
| 2010/0277447 A1 | 11/2010 | Itoh et al. | |
| 2012/0008073 A1* | 1/2012 | Ota | G02F 1/133707 349/106 |
| 2012/0313844 A1 | 12/2012 | Im et al. | |
| 2013/0093986 A1 | 4/2013 | Kesho et al. | |
| 2013/0188109 A1 | 7/2013 | Chen | |
| 2014/0231790 A1 | 8/2014 | Fujino | |
| 2014/0340603 A1 | 11/2014 | Hu | |

FOREIGN PATENT DOCUMENTS

| | | |
|---|---|---|
| JP | 2004-78218 A | 3/2004 |
| JP | 2006-106659 A | 4/2006 |
| JP | 2006-259135 | 9/2006 |
| JP | 2007-41578 A | 2/2007 |
| JP | 2007-140530 A | 6/2007 |
| JP | 2007-293292 A | 11/2007 |
| JP | 2008-186006 A | 8/2008 |
| JP | 2009-276786 A | 11/2009 |
| JP | 2010-14794 A | 1/2010 |
| JP | 2013-15843 A | 1/2013 |
| JP | 2013-97049 A | 5/2013 |
| JP | 2013-113880 A | 6/2013 |
| JP | 2013-186165 A | 9/2013 |
| WO | WO 2007/148519 A1 | 12/2007 |
| WO | WO 2011/048843 A1 | 4/2011 |
| WO | WO 2013/051428 | 4/2013 |

OTHER PUBLICATIONS

Office Action dated Oct. 2, 2018 in Japanese Patent Application No. 2017-231603, 7 pages (with English language translation).

* cited by examiner

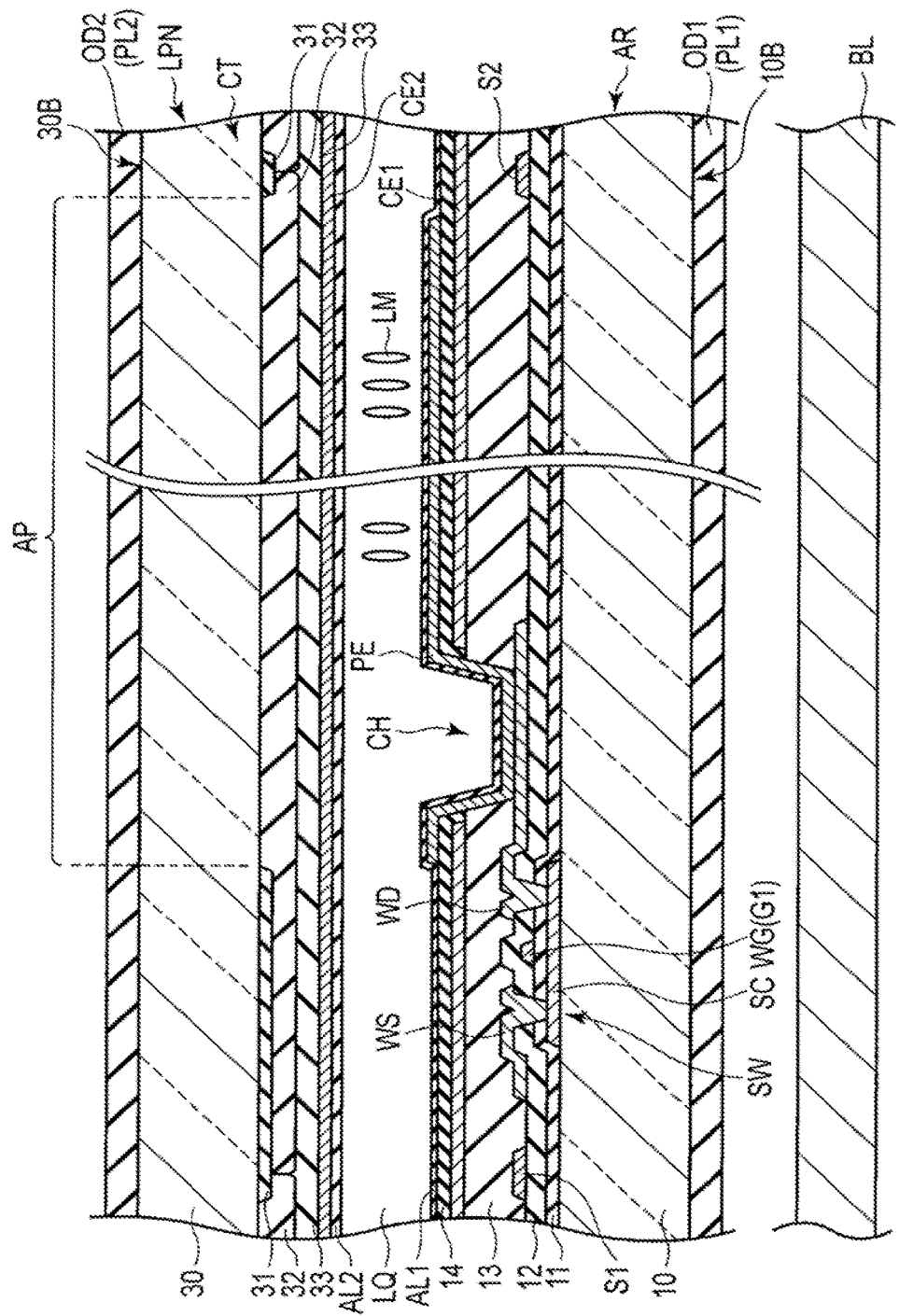
F I G. 4

DISPLAY DEVICE

CROSS-REFERENCE TO RELATED APPLICATIONS

This application is a continuation of U.S. application Ser. No. 14/516,858, filed Oct. 17, 2014, which is based upon and claims the benefit of priority from Japanese Patent Application No. 2013-217441, filed Oct. 13, 2013, the entire contents of which are incorporated herein by reference.

FIELD

Embodiments described herein relate generally to a display device.

BACKGROUND

In recent years, in color display devices, methods for improving display luminance have been proposed. As an example, there has been proposed a liquid crystal display device in which one unit pixel is constituted by arranging a red (R) pixel, a green (G) pixel, a blue (B) pixel and a white (W) pixel in a row direction in a predetermined order.

The white pixel has a higher efficiency of use of light than the red pixel, green pixel and blue pixel, and the transmittance of the white pixel is about three times higher than the transmittance of each of the red pixel, green pixel and blue pixel. Thus, the area of the white pixel or the maximum value of the amount of transmissive light in the white pixel is not freely determined, but needs to be set in consideration of color reproducibility, etc. For example, the display luminance of the white pixel needs to be so set as to become a value lower than the total luminance of the red pixel, green pixel and blue pixel. Specifically, in a case where only the white pixel is enlarged, the display luminance is enhanced, but the color reproducibility deteriorates. In addition, the area of each of the red pixel, green pixel and blue pixel is sacrificed by an amount corresponding to the enlargement of the white pixel in the unit pixel of the limited area, and as a result the large white pixel cannot effectively be utilized.

Furthermore, in the case where the size of the white pixel has been enlarged, when an image with a high display luminance in the white pixel is displayed, the white pixel tends to be easily visually recognised, and consequently a displayed image tends to be visually recognized as a rough image.

BRIEF DESCRIPTION OF THE DRAWINGS

FIG. 4 is a view which schematically illustrates a cross-sectional structure of the liquid crystal display panel LPN in an active area including a switching element SW shown in FIG. 2.

DETAILED DESCRIPTION

Figure 1:
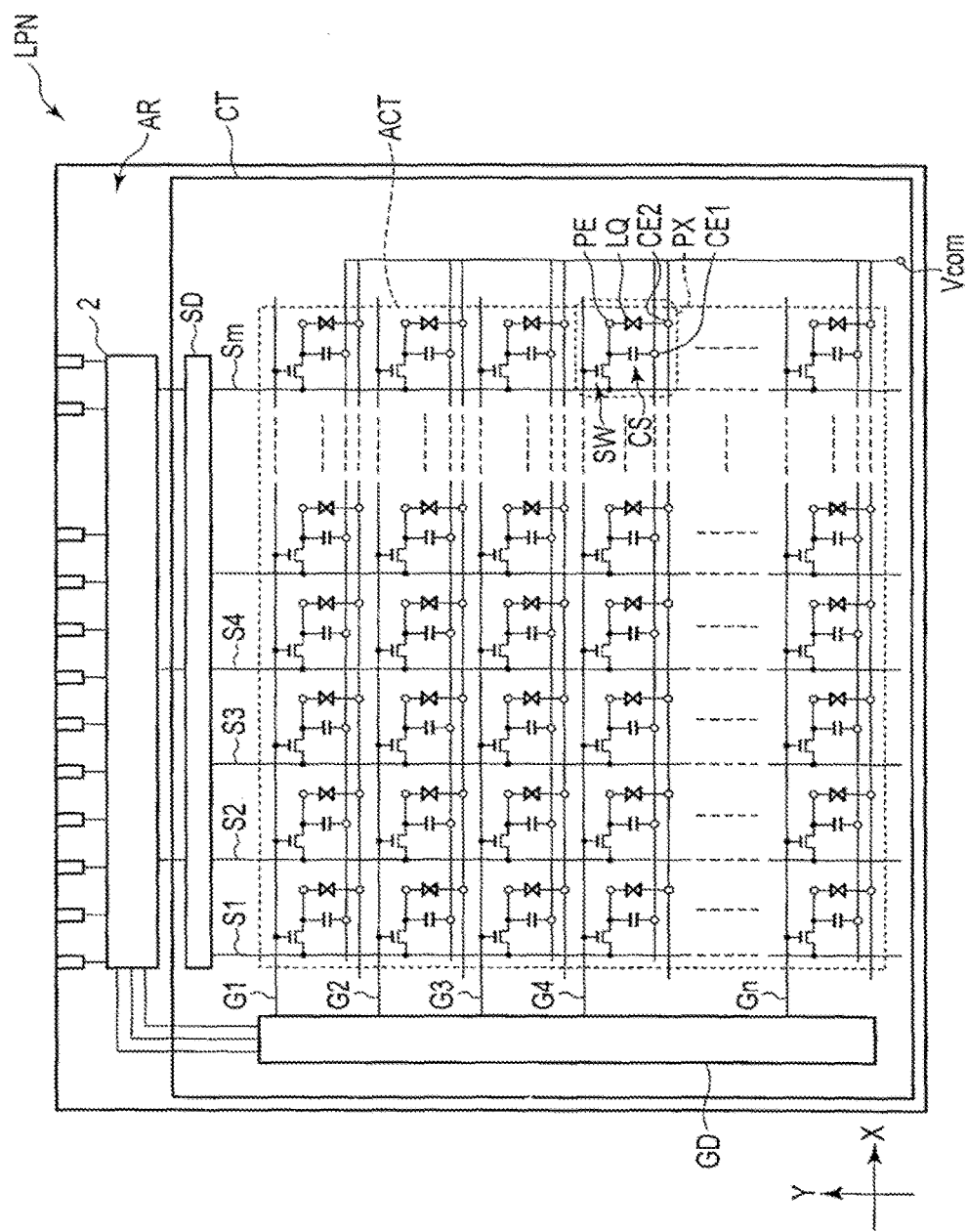
FIG. 1 is a view which schematically illustrates a structure and an equivalent circuit of a crystal display panel LPN which constitutes a display device according to an embodiment.

In general, according to one embodiment, a display device includes: a first color pixel; a second color pixel which is a pixel of a color different from a color of the first color pixel, and neighbors the first color pixel is a first direction; a third color pixel which is a pixel of a color different from the color of the first color pixel and the color of the second color pixel, and neighbors the second color pixel in the first direction; a fourth color pixel which is a pixel of the same color as the first color pixel, and neighbors the first color pixel in a second direction; a fifth color pixel which, is a pixel of the same color as the second color pixel, and neighbors the second color pixel in the second direction; and a sixth color pixel which is a pixel of a color different from the colors of the first color pixel, the second color pixel and the third color pixel, and neighbors the third color pixel in the second direction, wherein each of the first color pixel, the second color pixel, the fourth color pixel and the fifth color pixel has a first long-side length in the second direction, the third color pixel has a second long-side length in the second direction, which is greater than the first long-side length, and the sixth color pixel has a third long-side length in the second direction, which is less than the first long-side length.

According to another embodiment, a display-device includes: a first substrate including a first pixel electrode, a second pixel electrode neighboring the first pixel electrode in a first direction, a third pixel electrode neighboring the second pixel electrode in the first direction, a fourth pixel electrode neighboring the first pixel electrode in a second direction, a fifth pixel electrode neighboring the second pixel electrode in the second direction, and a sixth pixel electrode neighboring the third pixel electrode in the second direction; a second substrate including a first color filter extending in the second direction and opposed to the first pixel electrode and the fourth pixel electrode, a second color filter neighboring the first color filter in the first direction, extending in the second direction and opposed to the second pixel electrode and the fifth pixel electrode, a third color filter neighboring the second color filter in the first direction and opposed to the third pixel electrode, and a fourth color filter neighboring the third color filter in the second direction and opposed to the sixth pixel electrode; and a liquid crystal layer held between the first substrate and the second substrate, wherein each of the first pixel electrode, the second pixel electrode, the fourth pixel electrode and the fifth pixel electrode has a first long-side length in the second direction, the third pixel electrode has a second long-side length in the second direction, which is greater than the first long-side length, and the sixth pixel electrode has a third long-side length in the second direction, which is less than the first long-side length.

Embodiments will now be described in detail with reference to the accompanying drawings. In the drawings, structural elements having the same or similar functions are denoted by like reference numerals, and an overlapping description is omitted.

FIG. 1 is a view which schematically shows a structure and an equivalent circuit of a liquid crystal display panel LPN which constitutes a display device according to an embodiment.

Specifically, the display device includes an active-matrix-type liquid crystal display panel LPN. The liquid crystal display panel LPN includes an array substrate AR which is a first substrate, a counter-substrate CT which is a second substrate that is disposed to be opposed to the array substrate AR, and a liquid crystal layer LQ which is held between the array substrate AR and the counter-substrate CT. The liquid crystal display panel LPN includes an active area ACT which displays an image. The active area ACT corresponds to a region where the liquid crystal layer LQ is held between the array substrate AR and the counter-substrate CT, has a rectangular shape, for instance, and is composed of a plurality of pixels PX which are arrayed in a matrix.

The array substrate AR includes, in the active area ACT, a plurality of gate lines G (G1 to Gn) extending in a first direction X, a plurality of source lines S (S1 to Sm) extending in a second direction Y crossing the first direction X, a switching element SW which is electrically connected to the gate line G and source line S in each pixel PX, a pixel electrode PE which is electrically connected to the switching element SW in each pixel PX, and a first common electrode CE1 which is opposed to the pixel electrode PE. A storage capacitor CS is formed, for example, between the first common electrode CE1 and the pixel electrode PE.

On the other hand, the counter-substrate CT includes a second common electrode CE2 which is opposed to the pixel electrode PE via the liquid crystal layer LQ.

Each of the gate lines G is led out to the outside of the active area ACT and is connected to a first driving circuit GD. Each of the source lines S is led out to the outside of the active area ACT and is connected to a second driving circuit SD. At least parts of the first driving circuit GD and second driving circuit SD are formed on, for example, the array substrate AR, and are connected to a driving IC chip 2. The driving IC chip 2 incorporates a controller which controls the first driving circuit GD and second driving circuit SD, and functions as a signal supply source for supplying necessary signals for driving the liquid crystal display panel LPN. In the example illustrated, the driving IC chip 2 is mounted on the array substrate AR, on the outside of the active area ACT of the liquid crystal display panel LPN.

The first common electrode CE1 and second common electrode CE2 have the same potential, and each of them extends over substantially the entirety of the active area ACT and is formed commonly over a plurality of pixels PX. The first common electrode CE1 and second common electrode CE2 are led out to the outside of the active area ACT and are connected to a power supply module Vcom. The power supply module Vcom is formed, for example, on the array substrate AR on the outside of the active area ACT, and is electrically connected to the first common electrode CE1 and also electrically connected to the second common electrode CE2 via an electrically conductive member (not shown). At the power supply module Vcom, for example, a common potential, is supplied to the first common electrode CE1 and second common electrode CE2.

Figure 2:
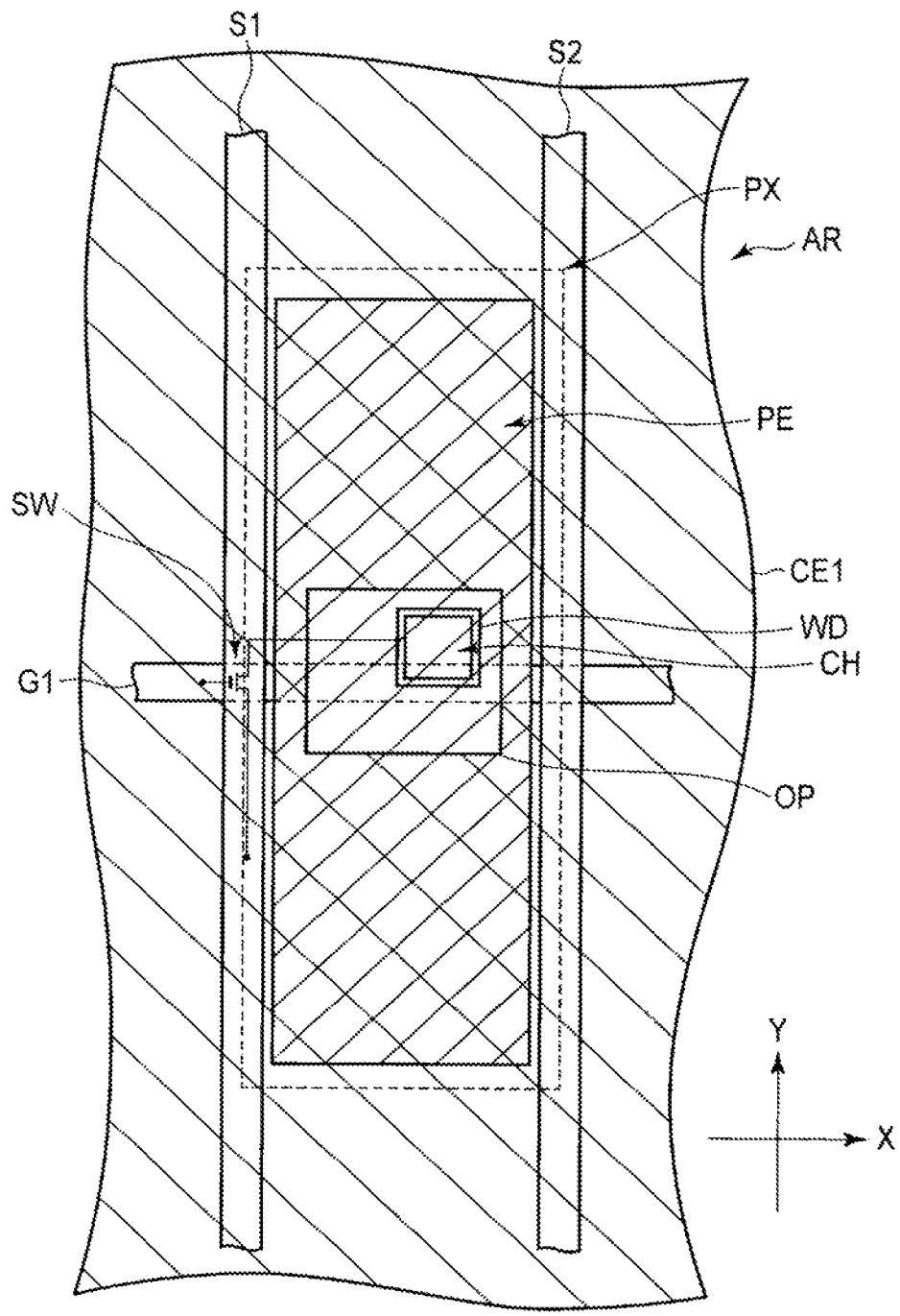
FIG. 2 is a plan view which schematically illustrates a structure example of one pixel PX of an array substrate AR which is applicable to the display device of the embodiment.

FIG. 2 is a plan view which schematically shows a structure example of one pixel PX of the array substrate AR which is applicable to the display device of the embodiment.

The array substrate AR includes a gate line G1, a source line S1, a source line S2, a switching element SW, a first common electrode CE1, and a pixel electrode PE. In the example illustrated, as indicated by a broken line in FIG. 2, the pixel PX has a rectangular shape with a pair of short sides parallel to the first direction X, and a pair of long sides parallel to the second direction Y.

The gate line G1 extends linearly in the first direction X. The source line S1 and source line S2 are disposed with a distance in the first direction X, and extend linearly in the second direction Y, respectively. The length of the pixel PX in the first direction X is substantially equal to the pitch of neighboring source lines in the first direction X. The length of the pixel PX in the second direction Y is substantially equal to the pitch of neighboring gate lines in the second direction Y.

In the pixel PX illustrated, the source line S1 is located at a left side end portion, and is disposed to extend over a boundary between the pixel PX and a pixel neighboring on the left side. The source line S2 is located at a right side end portion, and is disposed to extend over a boundary between the pixel PX and a pixel neighboring on the right side. The gate line G1 is disposed in a manner to cross a central portion of the pixel PX. In the present embodiment, as illustrated, there is no storage capacitance line which crosses the pixel PX for forming a storage capacitance CS.

The switching element SW is composed of, for example, an n-channel thin-film transistor (TFT). Although a detailed illustration is omitted, the switching element SW includes a semiconductor layer of, e.g. polysilicon, a gate electrode connected to the gate line G1, a source electrode which is connected to the source line S1 and is put in contact with the semiconductor layer, and a drain electrode WD which is in contact with the semiconductor layer.

As indicated by lower-right hatching lines in the Figure, the first common electrode CE1 is disposed over substantially the entirety of the pixel PX, and further extends from the pixel PX beyond the source line S1 and source line S2 in the first direction X and extends in the second direction Y. Specifically, the first common electrode CE1 is opposed to the source line S1 and source line S2 and is formed continuously over pixels neighboring the pixel PX in the first direction X. In addition, the first common electrode CE1 is formed continuously over pixels neighboring the pixel PX in the second direction Y. Furthermore, although not described in detail, the first common electrode CE1 is disposed over substantially the entirety of the active area which displays an image, and a part thereof is led out to the outside of the active, area and electrically connected to the power supply module, as described above. It should be noted, however, that an opening OP for exposing the drain electrode WD is formed in the first common electrode CE1.

In the meantime, the first common electrode CE1 may be formed such that, while the first common electrode CE1 is disposed over substantially the entirety of the pixel PX, the first common electrode CE1 is made discontinuous at an area overlapping the gate line G1, the first common electrode CE1 extends from the pixel PX over the source line S1 and source line S2 in the first direction X, the first common electrode CE1 is opposed to the source line S1 and source line S2, and the first common electrode CE1 is continuously formed in a strip shape over pixels neighboring the pixel PX in the first direction X. In this case, too, the first common electrode CE1 is led out to the outside of the active area which displays an image, and is electrically connected to the power supply module, as described above.

As indicated by upper-right hatching lines in the Figure, the pixel electrode PE is formed in an island shape in the pixel PX, and is opposed to the first common electrode CE1. Incidentally, in the example illustrated, although only the pixel electrode PE disposer in the pixel PX is depicted, pixel electrodes are also disposed in other pixels neighboring the pixel PX in the first direction X and second direction Y. The pixel electrode PE is electrically connected to the drain electrode WD of the switching element SW via a contact hole CH. The shape of the pixel electrode PE illustrated corresponds to, for example, the shape of the pixel PX, and is a rectangular shape having a less length in the first direction X than in the second direction Y. The contact hole CH is located at a substantially central part of the pixel electrode PE. Incidentally, a part of the pixel electrode PE may extend to positions overlapping the source line S1 and source line S2.

In the present embodiment, the structure of each pixel of the active area is identical to the above-described structure example. However, the active area includes pixels of different pixel sizes, i.e. different lengths in the first direction X and second direction Y.

Figure 3:
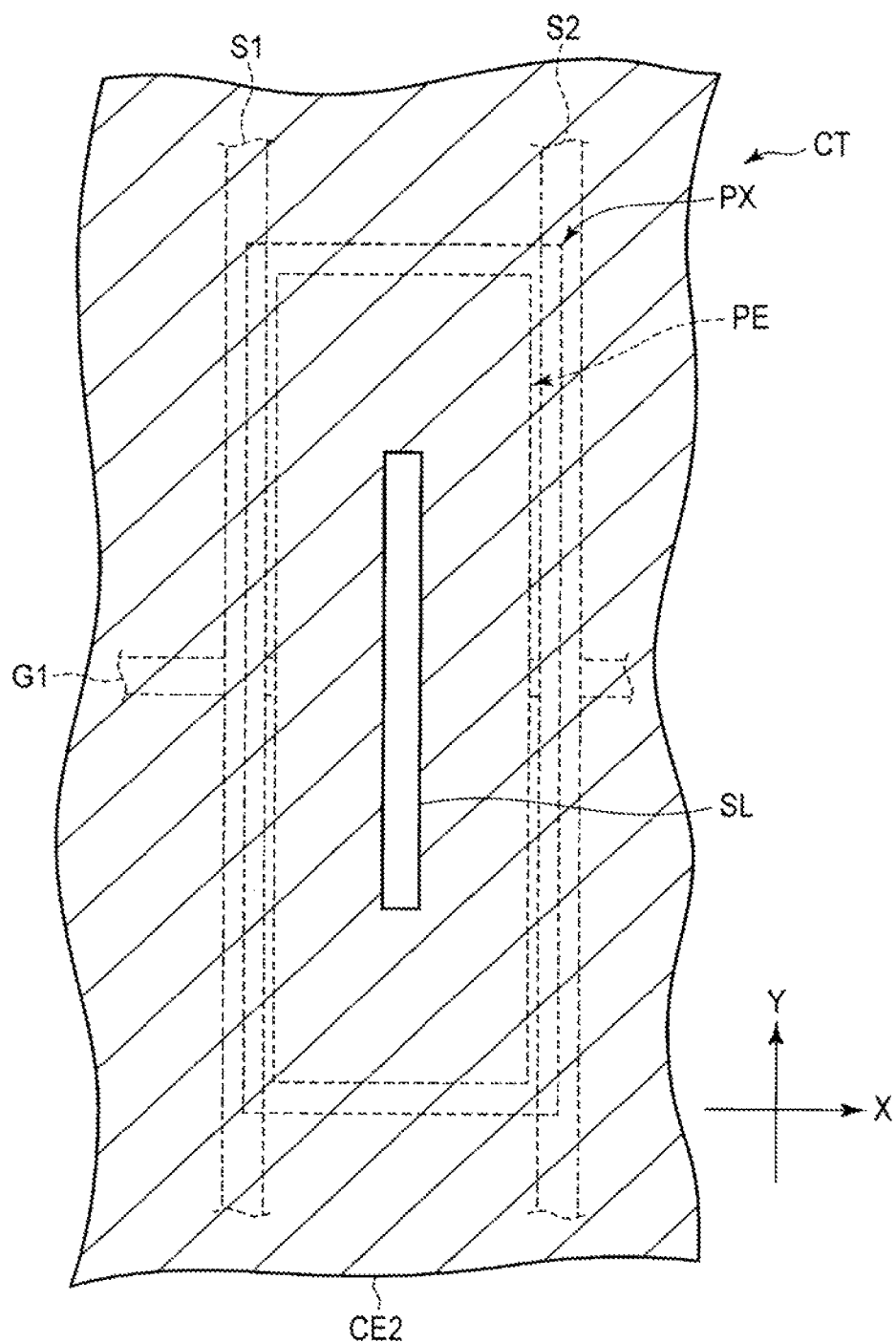
FIG. 3 is a plan view which schematically illustrates a structure example of one pixel PX of a counter-substrate CT which is applicable to the display device of the embodiment.

FIG. 3 is a plan view which schematically shows a structure example of one pixel PX of the counter-substrate CT which is applicable to the display device of the embodiment. FIG. 3 shows only structural parts that, are necessary for the description, and the source line S1, source line S2, gate line G1, and pixel electrode PE, which are main parts of the array substrate, are indicated by broken lines, and the depiction of the first common electrode is omitted.

The counter-substrate CT includes a second common electrode CE2. The second common electrode is disposed in the pixel PX, and is opposed to the pixel electrode PE. In addition, the second common electrode CE2 extends from the pixel PX in the first direction X and the second direction Y, and is located also above the source line S1 and source line S2. Specifically, although not described in detail, the second common electrode CE2 is disposed continuously over pixels neighboring on the right side and left side along the first direction X of the pixel PX, and pixels neighboring on the upper side and lower side along the second direction Y of the pixel PX. Furthermore, although not described in detail, the second common electrode CE2 is disposed over almost the entirety of the active area.

A slit SL is formed in the second common electrode CE2 at a position opposed to the pixel electrode PE. In the example illustrated, the slit SL is formed in a strip shape extending in the second direction Y, and is located substantially at a central part of the pixel PX. This slit SL corresponds to an alignment control member which mainly controls the alignment of liquid crystal molecules. In the meantime, instead of the slit, some other alignment control member, such as a projection stacked on the second common electrode CE2, may be disposed, if such an alignment control member has a function of controlling the alignment of liquid crystal molecules. In addition, the shape of the slit SL is not limited to the example illustrated, and may be, for instance, a cross shape.

FIG. 4 is a view which schematically illustrates a cross-sectional structure of the liquid crystal display panel LPN in the active area including the switching element SW shown in FIG. 2.

The array substrate AR is formed by using a first insulative substrate 10 having light transmissivity, such as a glass substrate or a resin substrate. The array substrate AR includes, on that side of the first insulative substrate 10, which is opposed to the counter-substrate CT, a switching element SW, a first, common electrode CE1, a pixel electrode PE, a first insulation film 11, a second insulation film 12, a third insulation film 13, a fourth insulation film 14, and a first vertical alignment film AL1.

In the example illustrated, the switching element SW is a thin-film transistor of a top gate type. The switching element SW includes a semiconductor layer SC which is disposed on the first insulative substrate 10. In the meantime, an under-coat layer, which is an insulation film, may be interposed between the first insulative substrate 10 and the semiconductor layer SC. The semiconductor layer SC is covered with the first insulation film 11. The first insulation film 11 is also disposed on the first insulative substrate 10. This first insulation film 11 is formed of, for example, an inorganic material, such as silicon nitride.

A gate electrode WG of the switching element SW is formed on the first insulation film 11, and is located immediately above the semiconductor layer SC. The gate electrode WG is electrically connected to the gate, line G1 (or formed integral with the gate line G1) and is covered with the second insulation film 12. The second insulation film 12 is also disposed on the first insulation film 11. This second insulation film 12 is formed of, for example, an inorganic material such as tetraethoxysilane (TEOS).

A source electrode WS and a drain electrode WD of the switching element SW are formed on the second insulation film 12. The source line S1 and source line S2 are similarly formed on the second insulation film 12. The source electrode WS illustrated is electrically connected to the source line S1 (or formed integral with the source line S1). The source electrode WS and drain electrode WD are put in contact with the semiconductor layer SC via contact holes, penetrating the first insulation film 11 and second insulation film 12. The switching element SW with this structure, as well as the source line S1 and source line S2, is covered with the third insulation film 13. The third insulation film 13 is also disposed on the second insulation film 12. This third insulation film 13 is formed of, for example, a transparent resin material.

The first common electrode CE1 extends over the third insulation film 13. As illustrated in the Figure, the first common electrode CE1 covers the upper side of the source line S1 and source line S2, and extends toward neighboring pixels. The first common electrode CE1 is formed of a transparent, electrically conductive material such as indium tin oxide (ITO) or indium sine oxide (IZO). The fourth insulation film 14 is disposed on the first common electrode CE1. A contact hole CH, which penetrates to the drain electrode WD, is formed in the third insulation film 13 and fourth insulation film 14. The fourth insulation film 14 has a less thickness than the third insulation film 13, and is formed of, for example, an inorganic material such as silicon nitride. The fourth insulation film 14 corresponds to an inter-layer insulation film which covers the first common electrode CE1.

The pixel electrode PE is formed in an island shape on the fourth insulation film 14 and is opposed to the first common electrode CE1. The pixel electrode PE is electrically connected to the drain electrode WD of the switching element SW via the contact hole CH. This pixel electrode PE is formed of a transparent, electrically conductive material such as ITO or IZO. The pixel electrode PE is covered with the first vertical alignment film AL1.

On the other hand, the counter-substrate CT is formed by using a second insulative substrate 30 with light transmissivity, such as a glass substrate or a resin substrate. The counter-substrate CT includes, on that side of the second insulative substrate 30, which is opposed to the array substrate AR, a light-shield layer 31, color filters 32, an overcoat layer 33, a second common electrode CE2, and a second vertical alignment film AL2.

The light-shield layer 31 partitions each pixel PX in the active area ACT, and forms an aperture portion AP. The light-shield layer 31 is provided at boundaries between color pixels, or at positions opposed to the source lines provided on the array substrate AR. The light-shield layer 31 is formed of a light-shielding metallic material or a black resin material.

The color filter 32 is formed in the aperture portion AP, and a part thereof overlaps the light-shield layer 31. The color filters 32 include a red color filter formed of a resin material which is colored in red, a green color filter formed of a resin material which is colored in green, and a blue color filter formed of a resin material which is colored in blue. The red color filter is disposed in a red pixel which displays red, the green color filter is disposed in a green pixel which displays green, and the blue color filter is disposed in a blue pixel which displays blue. In addition, a white Cox transparent) color-filter is disposed in a white pixel which displays white. Incidentally, no color filter may be disposed in the white pixel. Besides, the white color filter may not strictly be an achromatic color filter, and may be a color filter which is lightly colored (e.g. colored in light yellow). Boundaries between the color filters 32 of different colors are located at positions overlapping the light-shield layer 31 above the source lines S.

The overcoat layer 33 covers the color filters 32. The overcoat layer 33 planarizes asperities of the light-shield layer 31 and color filters 32. The overcoat layer 33 is formed of, for example, a transparent resin material. This overcoat layer 33 serves as an underlayer of the second common electrode CE2.

The second common electrode CE2 is formed on that side of the overcoat layer 33, which is opposed to the array substrate AR. As illustrated in the Figure, the second common electrode CE2 extends above the source line S1 and source line S2, and extends toward the neighboring pixels. The second common electrode CE2 is formed of, for example, a transparent, electrically conductive material such as ITO or IZO. The second common electrode CE2 is covered with the second vertical alignment film AL2.

The first vertical alignment film AL1 and second vertical alignment film AL2 are formed of a material which exhibits vertical alignment properties, and have an alignment restriction force which aligns liquid crystal molecules in a normal direction of the substrate, without requiring alignment treatment such as rubbing.

The above-described array substrate AR and counter-substrate CT are disposed such that their first vertical alignment film AL1 and second vertical alignment film AL2 are opposed to each other. In this case, a predetermined cell gap is created between the array substrate AR and the counter-substrate CT by columnar spacers which are formed on one of the array substrate AR and counter-substrate CT. The array substrate AR and counter-substrate CT are attached by a sealant in the state in which the cell gap is created. The liquid crystal layer LQ is sealed between the first vertical alignment film AL1 and second vertical alignment film AL2. This liquid crystal layer LQ is composed of a liquid crystal composition with a negative dielectric constant anisotropy (negative-type).

A backlight unit BL is disposed on the back side of the liquid crystal display panel LPN having the above-described structure. Various modes are applicable to the backlight unit BL, but a description of the detailed structure of the backlight unit BL is omitted here.

A first optical element OD1 including a first, polarizer PL1 is disposed on an outer surface 10B of the first insulative substrate 10. A second optical element OD2 including a second polarizer PL2 is disposed on an outer surface 30B of the second insulative substrate 30. The first polarizer PL1 and second polarizer PL2 are disposed, for example, in a positional relationship of crossed Nicols in which their polarization axes are perpendicular to each other.

Figure 5:
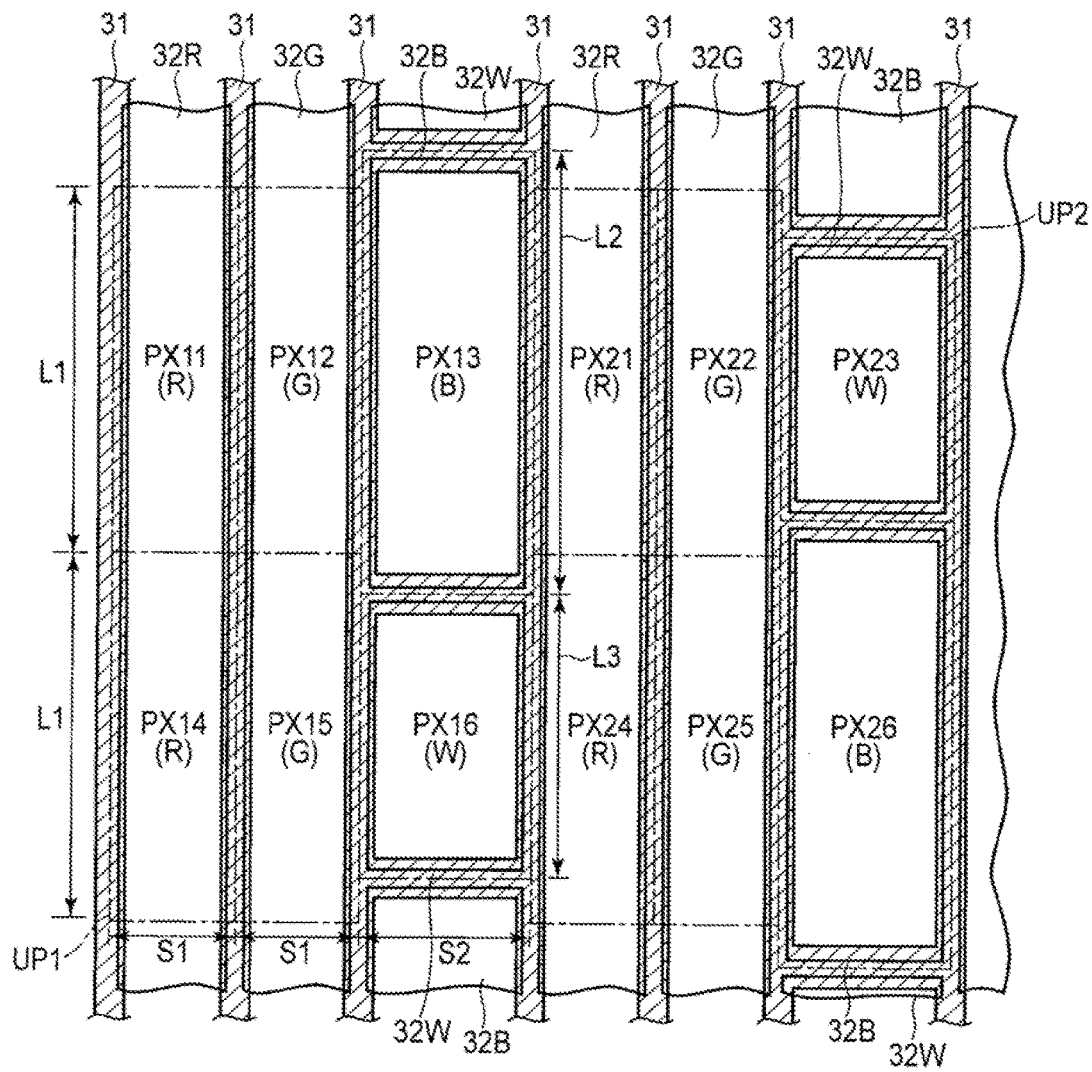
FIG. 5 is a plan view which schematically illustrates an example of a layout of pixels and color filters in the embodiment.

FIG. 5 is a plan view which schematically illustrates an example of a layout of pixels and color filters in the embodiment. In this example, the first direction X and second direction Y are perpendicular to each other.

A unit pixel for realizing color display is composed of a plurality of different color pixels. The unit pixel is a minimum unit which constitutes a color image that is displayed on the active area. In this example, two unit pixels, namely a unit pixel UP1 and a unit pixel UP2, which are arranged in the first direction X, are illustrated. Each of the unit pixel UP1 and unit pixel UP2 is composed of six color pixels.

The unit pixel UP1 is composed of a color pixel (first color pixel) PX11, a color pixel (second color pixel) PX12, a color pixel (third color pixel) PX13, a color pixel (fourth color pixel) PX14, a color pixel (fifth color pixel) BK15 and a color pixel (sixth color pixel) PX16. In the Figure, each color pixel, has a rectangular shape with a pair of short sides in the first direction X, and a pair of long sides in the second direction Y, and each color pixel is indicated by a one-dot-and-dash line. The color pixel PX12 is a pixel of a color different from the color of the color pixel PX11 and neighbors the color pixel PX11 in the first direction X. The color pixel PX13 is a pixel of a color different from the colors of the color pixel PX11 and color pixel PX12 and neighbors the color pixel PX12 in the first direction X. The color pixel PX14 is a pixel of the same color as the color pixel PX11 and neighbors the color pixel PX11 in the second direction Y. The color pixel PX15 is a pixel of the same color as the color pixel PX12 and neighbors the color pixel PX12 in the second direction Y. The color pixel PX16 is a pixel of a color different from the colors of the color pixel PX11, color pixel PX12 and color pixel PX13, and neighbors the color pixel PX13 in the second direction Y.

In this example, the color pixel PX11 and color pixel PX14 are red pixels, the color pixel PX12 and color pixel PX15 are green pixels, the color pixel PX13 is a blue pixel, and the color pixel PX16 is a white pixel.

Each of the color pixel PX11, color pixel PX12, color pixel PX14 and color pixel PX15 has a long-side length L1 in the second direction Y. The color pixel PX13 has a long-side length L2 in the second direction Y, which is greater than the long-side length L1. The color pixel PX16 has a long-side length L3 in the second direction Y, which is less than the long-side length L1.

Each of the color pixel PX11, color pixel PX12, color pixel PX14 and color pixel PX15 has a short-side length S1 in the first direction X. Each of the color pixel PX13 and color pixel PX16 has a second short-side length S2 in the first direction X, which is greater than the short-side length S1.

In this structure, the color pixel PX11, color pixel PX12, color pixel PX14 and color pixel PX15 are substantially equal in area. The color pixel PX13 has a larger area than the color pixel PX 16. In addition, the area of the color pixel PX13 is greater than the area of the color pixel PX11, etc., and is largest in the unit pixel UP1. The area of the color pixel PX16 is less than the area of the color pixel PX11, etc., and is smallest in the unit pixel UP1.

A set of the color pixel PX13 and color pixel PX16 is displaced in the second direction Y from a set of the color pixel PX12 and color pixel PX15. In the example illustrated, the set of the color pixel PX13 and color pixel PX16 is displaced to the upper side in the Figure, relative to the set of the color pixel PX12 and color pixel PX15. Specifically, the short side of the color pixel PX11 and the short side of the color pixel PX12 extend on the same straight line which is parallel to the first direction X, but the short side of the color pixel PX13 extends on an outside in the second direction from each of the short sides of the color pixel PX11 and color pixel PX12. In addition, the short side of the color pixel PX14 and the short side of the color pixel PX15 extend on the same straight line which is parallel to the first direction X, but the short side of the color pixel PX16 extends on an inside in the second direction from each of the short sides of the color pixel PX14 and color pixel PX15. In other words, the color pixel PX13 is enlarged to both the upper side and lower side in the Figure in the second direction Y, compared to the color pixel PX12, and the color pixel PX16 is reduced in the second direction Y, compared to the color pixel PX15.

The unit pixel UP2 has a configuration which is similar to the configuration of the unit pixel UP1, but the unit pixel UP2 is different from the unit pixel UP1 in that the white pixel and the blue pixel are transposed. Specifically, the unit pixel UP2 is composed of a color pixel PX21, a color pixel PX22, a color pixel PX23, a color pixel PX24, a color pixel PX25 and a color pixel PX26. The color pixel PX21 and color pixel PX24 are red pixels, the color pixel PX22 and color pixel PX25 are green pixels, the color pixel PX23 is a white pixel, and the color pixel PX26 is a blue pixel.

Specifically, in the unit pixel UP1 and unit pixel UP2 arranged in the first direction X, the color pixel PX13 and color pixel PX26, which are blue pixels, are located at positions displaced from a same straight line in the first direction X. In addition, the color pixel PX16 and color pixel PX23, which are white pixels, are located at positions displaced from a same straight line in the first direction X.

Light-shield layers 31 are disposed at boundaries of the respective color pixels. Each light-shield layer 31 extends linearly in the second direction Y. Incidentally, no light-shield layer 31 is disposed at a boundary between color pixels, of the same color. Specifically, no light-shield layer 31 is disposed at a boundary between the color pixel PX11 and color pixel PX14, or between the color pixel PX12 and color pixel PX15. The light-shield layer 31 is disposed at a boundary between color pixels of different colors. Specifically, the light-shield layer 31 extending linearly in the first direction X is disposed at a boundary between the color pixel PX13 and color pixel PX16. Thus, each of the color pixel PX13 and color pixel PX16 is surrounded by the light-shield layers 31.

A color filter (first color filter) 32R is formed in a strip shape extending in the second direction Y, A color filter (second color filter) 32G neighbors the color filter 32R in the first direction X, and is formed in a strip shape extending in the second direction Y. A color filter (third color filter) 32B neighbors the color filter 32G in the first direction X, and is formed in an island shape. A color filter (fourth color filter) 32W neighbors the color filter 32B in the second direction Y, neighbors the color filter 32G in the first direction X, and is formed in an island shape. The color filter 32B and color filter 32W are alternately disposed in the second direction Y.

The color filter 32R is disposed to correspond to the color pixels PX11 and color pixel PX14 of the unit pixel UP1, and is disposed to correspond to the color pixels PX21 and color pixel PX24 of the unit pixel UP2. The color filter 32G is disposed to correspond to the color pixels PX12 and color pixel PX15 of the unit pixel UP1, and is disposed to correspond to the color pixels PX22 and color pixel PX25 of the unit pixel UP2. The color filter 32B is disposed to correspond to the color pixel PX13 of the unit pixel UP1, and is disposed to correspond to the color pixel PX26 of the unit pixel UP2. The color filter 32W is disposed to correspond to the color pixel PX16 of the unit pixel UP1, and is disposed to correspond to the color pixels PX23 of the unit pixel UP2.

The color filter 32R and color filter 32G have an equal width in the first direction X. The color filter 32B and color filter 32W have an equal width in the first direction X, and this width is greater than the width of the color filter 32R, etc.

The color filter 32R is a red (R) color filter. The color filter 32G is a green (G) color filter. The color filter 32B is a blue (B) color filter. The color filter 32W is a white (W) color filter. The first to fourth color filters have mutually neighboring end portions overlapping the light-shield layers 31.

In this manner, the active area includes the color pixels of the four colors (red pixels, green pixels, blue pixels, and white pixels), and the number of color pixels of two colors (in the illustrated example, blue pixels and white pixels) of the four colors is half the number of color pixels of the other two colors (in the illustrated example, red pixels and green pixels). In addition, the long-side length of the color pixels, the number of which is smaller, is different from the long-side length of the color pixels, the number of which is larger. Furthermore, the short-side length of the color pixels, the number of which is smaller, is different from the short-side length of the color pixels, the number of which is larger.

For example, the sum of the areas of the color pixel PX11 and color pixel PX14, which are the red pixels, is equal to the sum of the areas of the color pixel PX12 and color pixel PX15, which are the green pixels, and is equal to the area of the color pixel PX13 which is the blue pixel. However, the area of each color pixel may be varied by altering the long-side length and short-side length of the color pixel in accordance with the transmittance of each of the color filter 32R which is applied to the red pixel, the color filter 32G which is applied to the green pixel, and the color filter 32B which is applied to the blue pixel. In the case where the transmittance of the color filter B is higher than the transmittance of the color filter 32R and color filter 32G, the area of the color pixel PX13 may be made smaller than the sum of the areas of the color pixel PX11 and color pixel PX14 which are the red pixels.

Figure 6:
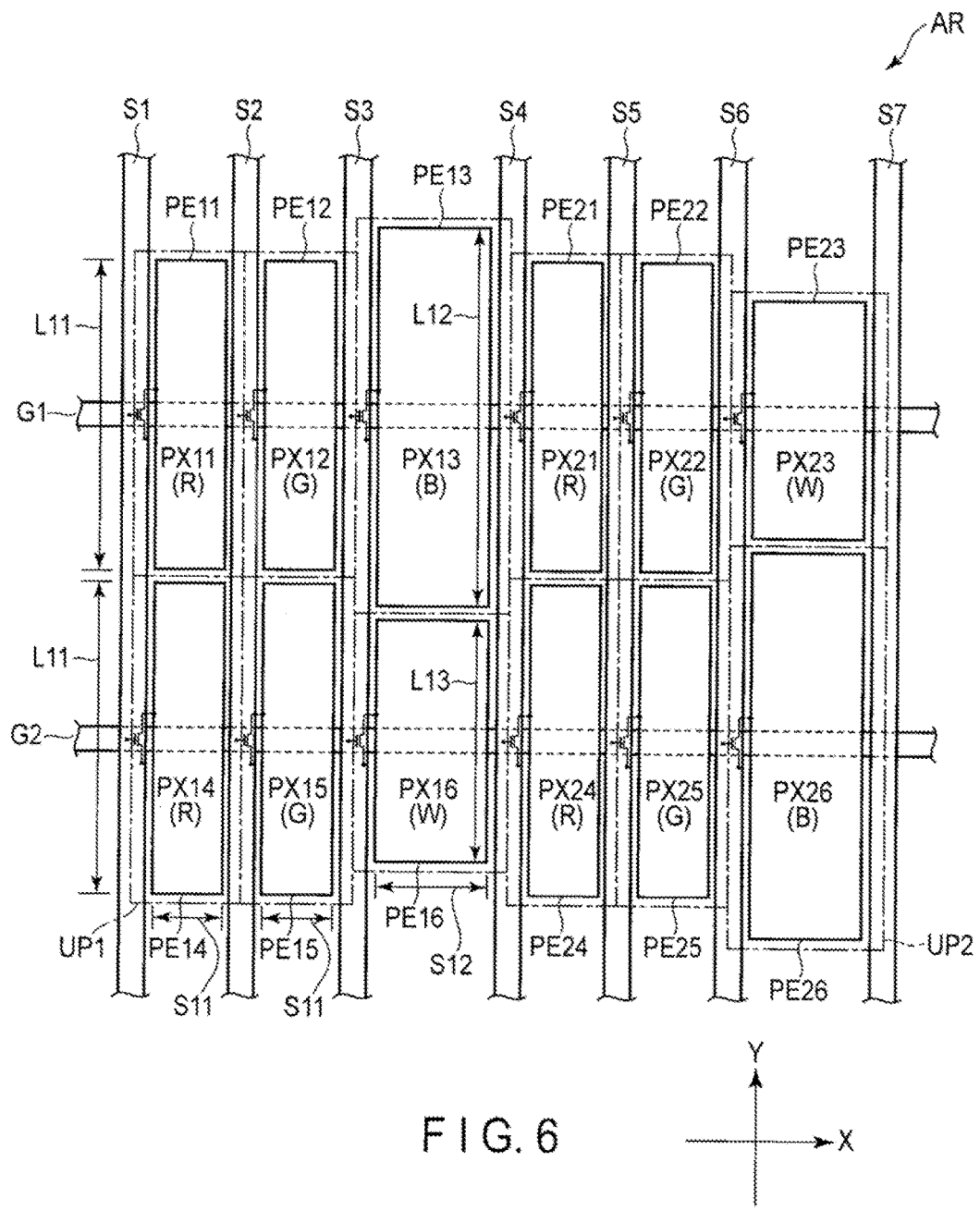
FIG. 6 is a plan view which schematically illustrates a structure example of an array substrate AR to which the color filters shown in FIG. 5 are applied.

FIG. 6 is a plan view which schematically illustrates a structure example of an array substrate AR to which the color filters shown in FIG. 5 are applied. In this example, only the structure of the array substrate AR, which is necessary for the description, is illustrated, and depiction of the first common electrode, etc. is omitted.

A gate line G1 extends in the first direction X and crosses central portions of the color pixel PX11, color pixel PX12, color pixel PX13, color pixel PX21, color pixel PX22 and color pixel PX23. A gate line G2 extends in the first direction X and crosses central portions of the color pixel PX14, color pixel PX15, color pixel PX16, color pixel PX24, color pixel PX25 and color pixel PX26.

A pixel electrode (first pixel electrode) PE11 is disposed to correspond to the color pixel PX11, and is connected to a source line S1 via a switching element which is connected to the gate line G1. A pixel electrode (second pixel electrode) PE12 is disposed to correspond to the color pixel PX12 and neighbors the pixel electrode PE11 in the first direction X. The pixel electrode PE12 is connected to a source line S2 via a switching element which is connected to the gate line G1. A pixel electrode (third pixel electrode) PE13 is disposed to correspond to the color pixel PX13 and neighbors the pixel electrode PE12 in the first direction X. The pixel electrode PE13 is connected to a source line S3 via a switching element which is connected to the gate line G1.

A pixel electrode (fourth pixel electrode) PE14 is disposed to correspond to the color pixel PX14 and neighbors the pixel electrode PE11 in the second direction Y. The pixel electrode PE14 is connected to the source line S1 via a switching element which is connected to a gate line G2. A pixel electrode (fifth pixel electrode) PE15 is disposed to correspond to the color pixel PX15 and neighbors the pixel electrode PE12 in the second direction Y. The pixel electrode PE15 is connected to the source line S2 via a switching element which is connected to the gate line G2. A pixel electrode (sixth pixel electrode) PE16 is disposed to correspond to the color pixel PX16 and neighbors the pixel electrode PE13 in the second direction Y. The pixel electrode PE16 is connected to the source line S3 via a switching element which is connected to the gate line G2.

Each of the pixel electrode PE11, pixel electrode PE12, pixel electrode PE14 and pixel electrode PE15 has a long-side length L11 in the second direction Y. The pixel electrode PE13 has a long-side length L12 in the second direction Y, which is greater than the long-side length L11. The pixel electrode PE16 has a long-side length L13 in the second direction Y, which is less than the long-side length L11.

Each of the pixel electrode PE11, pixel electrode PE12, pixel electrode PE14 and pixel electrode PE15 has a short-side length S11 in the first direction X. Each of the pixel electrode PE13 and pixel electrode PE16 has a short-side length S12 in the first, direction X, which is greater than the short-side length S11.

The pixel electrode PE11 and pixel electrode PE14 arranged in the second direction Y are opposed to the color filter 32R shown in FIG. 5. The pixel electrode PE12 and pixel electrode PE15 arranged in the second direction Y are opposed to the color filter 32G shown in FIG. 5. The pixel electrode PE13 is opposed to the color filter 32B shown in FIG. 5. The pixel electrode PE16 is opposed to the color filter 32W shown in FIG. 5.

In this structure, the pixel electrode PE11, pixel electrode PE12, pixel electrode PE14 and pixel electrode PE15 are substantially equal in area. The pixel electrode PE13 has a larger area than the pixel electrode PE16. In addition, the area of the pixel electrode PE13 is greater than the area of the pixel electrode PE11, etc., and is largest in the unit pixel UP1. The area of the pixel electrode PE16 is less than the area of the pixel electrode PE11, etc., and is smallest in the unit pixel UP1.

The short side of the pixel electrode PE11 and the short side of the pixel electrode PE12 extend on the same straight line which is parallel to the first direction X, but the short side of the pixel electrode PE13 extends on an outside from each of the short sides of the pixel electrode PE11 and pixel electrode PE12, that is, extends on a side away from the gate line G1. In addition, the short side of the pixel electrode PE14 and the short side of the pixel electrode PE15 extend on the same straight line which is parallel to the first direction X, but the short side of the pixel electrode PE16 extends on an inside from each of the short sides of the pixel electrode PE14 and pixel electrode PE15, that is, extends on a side closer to the gate line G2.

Incidentally, the pixel electrode PE21 is disposed to correspond to the color pixel PX21, the pixel electrode PE22 is disposed to correspond to the color pixel PX22, the pixel electrode PE23 is disposed to correspond to the color pixel PX23, the pixel electrode PE24 is disposed to correspond to the color pixel PX24, the pixel electrode PE25 is disposed to correspond to the color pixel PX25, and the pixel electrode PE26 is disposed to correspond to the color pixel PX26.

The pixel electrode PE21 and pixel electrode PS24 are opposed to the color filter 32R. The pixel electrode PE22 and pixel electrode PE25 are opposed to the color filter 32G. The pixel electrode PE23 is opposed to the color filter 32W. The pixel electrode PE26 is opposed to the color filter 32B.

Figure 7:
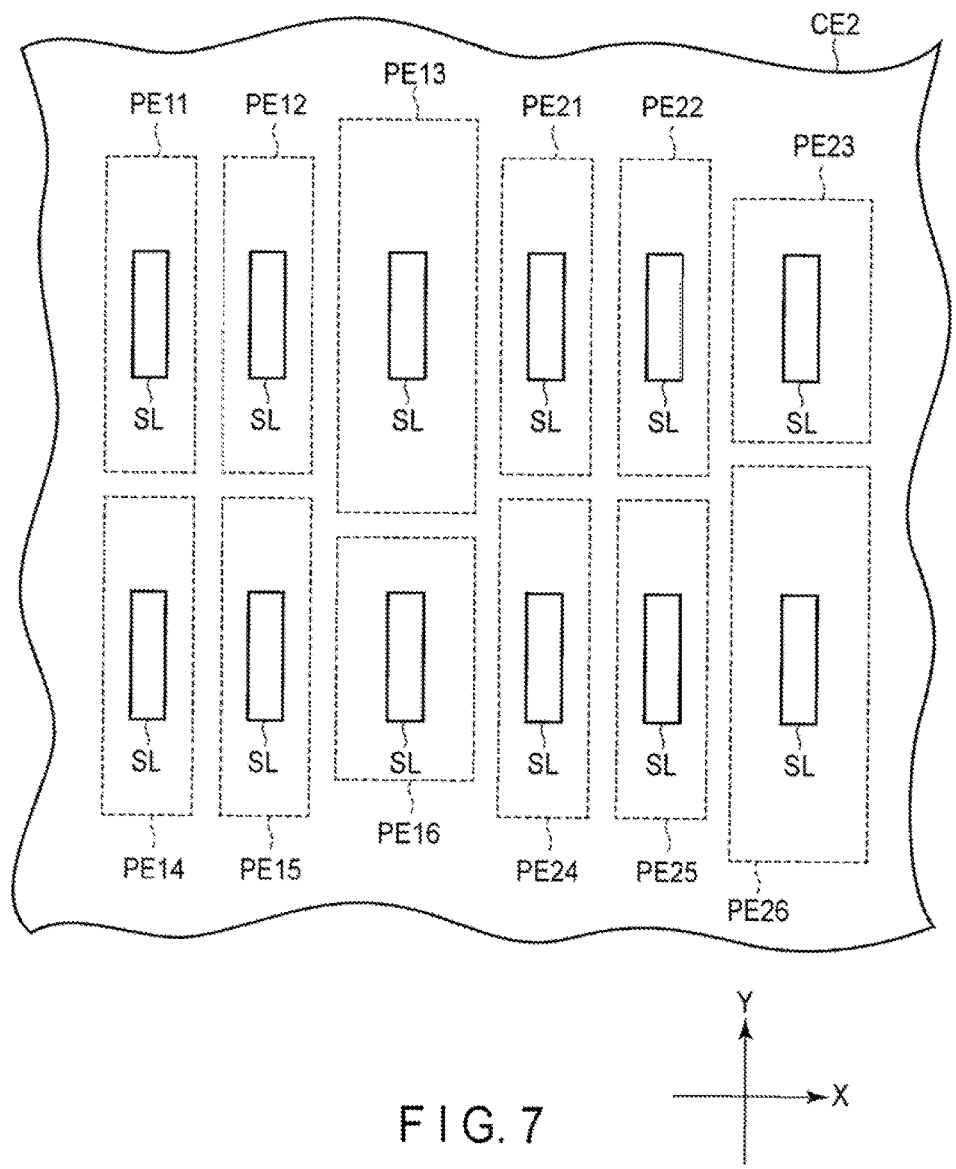
FIG. 7 is a plan view which schematically illustrates a structure example of a second common electrode CE2 which is disposed to be opposed to the array substrate AR shown in FIG. 6.

FIG. 7 is a plan view which schematically illustrates a structure example of the second common electrode CE2 which is disposed to be opposed to the array substrate AR shown in FIG. 6.

The second common electrode CE2 is opposed to the pixel electrodes PE11 to PE16 and the pixel electrodes PE21 to PE26. Slits SL are formed in the second common electrode CE2 at positions opposed to the pixel electrodes PE11 to PE16 and the pixel electrodes PE21 to PE26. The slits SL have substantially the same shape. In the example illustrated, each slit SL has a vertically elongated shape extending in the second direction Y.

Next, the operation of the display device in the embodiment is described.

In an OFF state in which no potential difference is produced between the pixel electrode PE and the first, coupon electrode CE1 and second common electrode CE2 (i.e. a state in which no voltage is applied to the liquid crystal layer LQ), no electric field is produced between the pixel electrode PE and second common electrode CE2. Thus, as illustrated in FIG. 4, liquid crystal molecules LM included in the liquid crystal layer LQ are initially aligned substantially perpendicular to the substrate major surface (X-Y plane) between the first vertical alignment film AL1 and second vertical alignment film AL2. At this time, part of linearly polarised light from the backlight unit BL passes through the first polarizer PL1 and enters the liquid crystal display panel LPN. The polarization state of the linearly polarized light, which enters the liquid crystal display panel LPN, hardly varies when the light passes through the liquid crystal layer LQ. Thus, the linearly polarized light emerging from the liquid crystal display panel LPN is absorbed by the second polarizer PL2 that is in the positional relationship of crossed. Nicols in relation to the first polarizer PL1 (black display).

In an ON state in which a potential difference is produced between the pixel electrode PE and the first common electrode CE1 and second common electrode CE2 (i.e. a state in which a voltage is applied to the liquid crystal layer LQ), a vertical electric field or an inclined electric field avoiding the slits SL is produced between the pixel electrode PE and second caramon electrode CE2. Thus, the liquid crystal molecules LM are aligned in a direction different from the initial alignment direction, by the effect of the vertical electric field or inclined electric field. Specifically, since negative-type liquid crystal molecules LM are aligned such that their major axes cross the electric field, the liquid crystal molecules LM are aligned in the ON state in an oblique direction or in a horizontal direction, relative to the substrate major surface.

In this ON state, the polarization state of the linearly polarized light, which enters the liquid crystal display panel LPN, varies depending on the alignment state of the liquid crystal molecules LM (or the retardation of the liquid crystal layer) when the light passes through the liquid crystal layer LQ. Thus, in the ON state, at least part of the light emerging from the liquid crystal layer LQ passes through the second polarizer PL2 (white display).

In addition, in the ON state, a storage capacitance CS is formed by the pixel electrode PE and the first common electrode CE1 chat, are opposed to each other via the fourth insulation film 14, and retains a necessary capacitance for displaying an image. Specifically, a pixel potential, which has been written in each pixel via the switching element SW, is retained in the storage capacitance CS for a predetermined period.

In the meantime, in the embodiment, the case of the linear polarization mode has been exemplarily illustrated. However, the embodiment is also applicable to a structure of a so-called circular polarization mode, in which a ¼ wavelength plate is inserted between each of the linear polarizers provided on the front and back sides of the liquid crystal display panel LPN, and the liquid crystal display panel LPN.

According to the present embodiment, the unit pixel is composed of six color pixels of 2 rows×3 columns, four of the six color pixels have an equal pixel size, one of the other two color pixels has a largest pixel size, and the other of the other two color pixels has a smallest pixel size. Each of these six color pixels is allocated to any one of a red pixel, a green pixel, a blue pixel, and a white pixel. Two color pixels in an identical column are allocated as red pixels. Two color pixels in an identical column are allocated as green pixels. A color pixel of the largest pixel size is allocated as a blue pixel, and a color pixel of the smallest pixel sloe is allocated as a white pixel. The blue pixel is located in the same column as the white pixel.

Thus, although color pixels of four columns need to be driven in a unit pixel configuration in which four color pixels of a red pixel, a green pixel, a blue pixel and a white pixel are arranged in the first direction, it should suffice to drive color pixels of three columns in the unit pixel configuration of the present embodiment, and an increase in power consumption can be suppressed.

In addition, since the number of color pixels arranged in the first direction is three, the restriction to the pitch in the first direction of color pixels constituting the unit pixel can be relaxed, compared to the case in which the number of color pixels arranged in the first direction is four. Thus, even in the case where the length in the first direction of the unit pixel has decreased because of a demand for higher fineness, the length in the first direction of each color pixel can be set with an allowance, compared to the processing limit.

Furthermore, since the pixel size of the blue pixel can be freely set by the short-side length in the first direction and the long-side length in the second direction, the pixel size of the blue pixel can properly be set in accordance with the pixel size or transmittance of each of the red pixels and green pixels. Therefore, optimal color reproducibility can be realized.

Besides, the pixel size of the white pixel can also be freely set by the short-side length in the first direction and the long-side length in the second direction. Thus, the display luminance of the white pixel can be freely set in a range lower than the total luminance of the red pixel, green pixel and blue pixel, and a higher luminance can be realized without degrading the color reproducibility. In addition, by substituting the display luminance of the white pixel for the white display luminance produced by the red pixel, green pixel and blue pixel, the display luminance in the unit pixel increases. Thus, the luminance of the backlight unit can be reduced by that degree, and the power consumption can be reduced. Furthermore, by virtue of the high luminance of the unit pixel, the visibility of a display image can be enhanced even in ambient light. In addition, since the pixel size of the white pixel does not excessively increase, the white pixel itself is less easily visually recognized even when an image with a high display luminance is displayed by the white pixel. Therefore, the display quality can be improved.

According to the embodiment, the capacitance, which is necessary for displaying an image in each pixel, can be formed by the pixel electrode PE and first common electrode CE1 which are opposed via the fourth insulation film 14. Thus, when the capacitance is formed, a wiring line or electrode, which crosses the pixel and is formed of a light-shielding wiring material, is needless. In addition, the fourth insulation film 14 is formed to have a smaller film thickness than the third insulation film that is formed of a resin material or the like. Therefore, a relatively large capacitance can easily be formed by the pixel electrode PE and first common electrode CE1 which are disposed via the fourth insulation film 14.

Moreover, since each of the pixel electrode PE and first common electrode CE1 is formed of a transparent, electrically conductive material, an area overlapping the pixel electrode PE and first common electrode CE1 contributes to display. Thus, compared to a comparative example in which a storage capacitance line crossing the pixel is disposed, the aperture ratio, transmittance or luminance per pixel, which contributes to display, can be improved. Therefore, while the capacitance necessary for display is secured, the display quality can be improved.

In addition, the first common electrode CE1 extends above the source line S1 and source line S2. Thus, in the on state, an undesired leak electric field from the source line toward the liquid crystal layer LQ can be shielded by the first common electrode CE1. Specifically, it is possible to suppress formation of an undesired electric field or an undesired capacitance between the source line and the pixel electrode PE or second common electrode CE2, and to suppress disturbance in alignment of liquid crystal molecules LM in an area overlapping the source line.

Furthermore, the liquid crystal molecules LM in the area overlapping the source line maintains the initial alignment state even in the ON state, since the first common electrode CE1 and second common electrode CE2 are kept at the same potential. Therefore, pixel electrodes PE neighboring in the first direction X can be located closer to each other up to a processing limit, and the area which contributes to display per pixel can further be increased.

Besides, even when one of the pixels neighboring with the source line interposed is in the ON state and the other is in the OFF state, there is no potential difference, by the first common electrode CE1 and second common electrode CE2, in the liquid crystal layer on the source line between the ON-state pixel and OFF-state pixel. Thus, the liquid crystal molecules LM in the area overlapping the source line are kept in the initial alignment state. Therefore, even when the liquid crystal display panel LPN is viewed in an oblique direction, degradation in display quality due to color mixing can be suppressed. In addition, since there is no need to increase the width of the light-shield layer 31 in order to prevent color mixing, the area contributing to display per pixel can further be increased.

Next, modifications will be described.

FIG. 3 is a plan view which schematically illustrates another structure example of the array substrate AR which is applicable to the display device of the embodiment.

Figure 8:
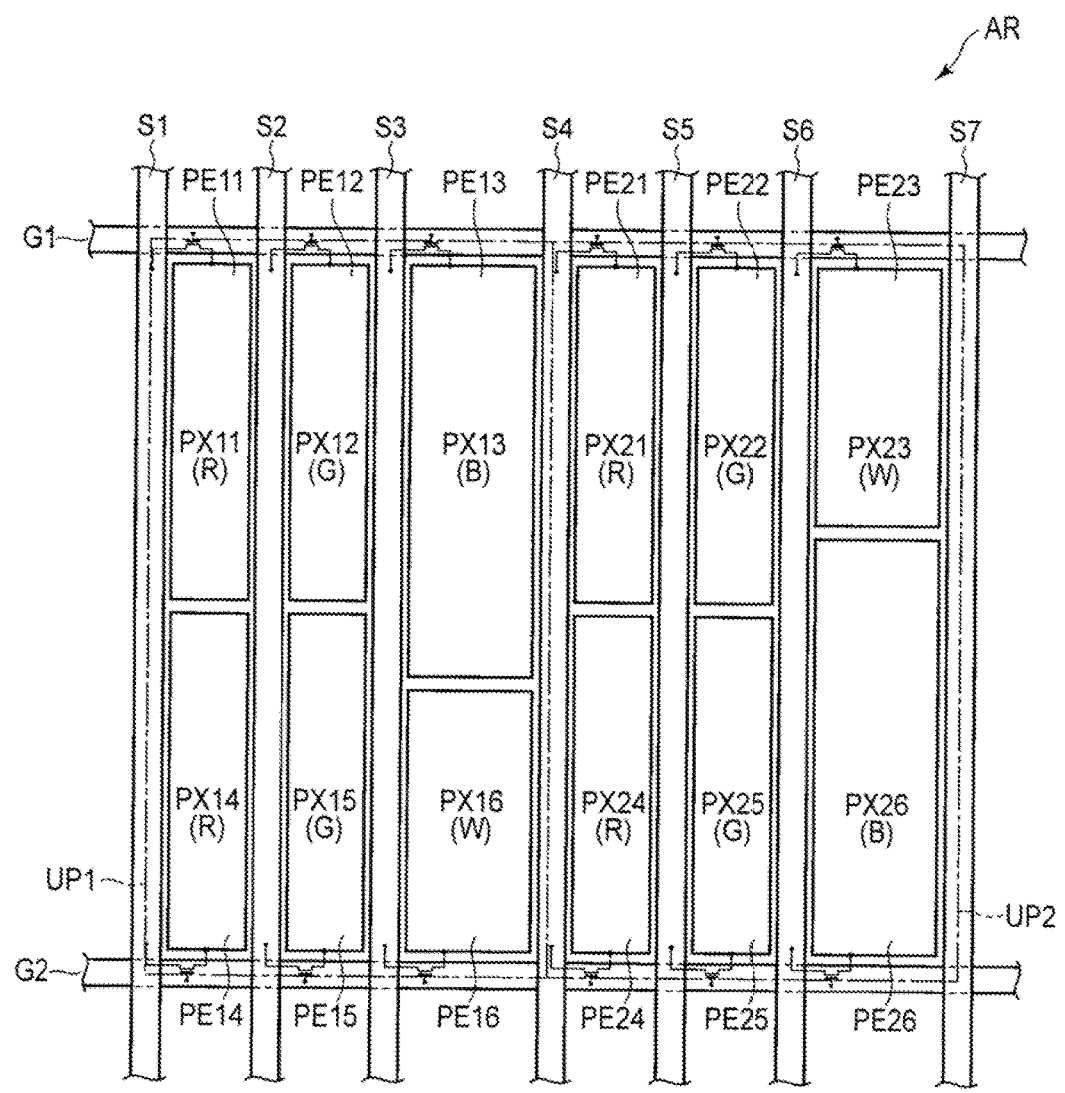
FIG. 8 is a plan view which schematically illustrates another structure example of the array substrate AR which is applicable to the display device of the embodiment.

The structure example illustrated in FIG. 8 differs from the array substrate AR of FIG. 6 in that the unit pixel adopts a rectangular layout.

The gate line G1 extends in the first direction X and is located at upper end portions of the color pixel PX11, color pixel PX12, color pixel PX13, color pixel PX21, color pixel PX22 and color pixel PX23. The gate line G2 extends in the first direction X and is located at lower end portions of the color pixel PX14, color pixel PX15, color pixel PX16, color pixel PX24, color pixel PX25 and color pixel PX26. The unit pixel UP1 end unit pixel UP2 have the same shape, and each of the unit, pixel UP1 and unit pixel UP2 has a rectangular shape with a pair of short sides in the first direction X and a pair of long sides in the second direction Y.

One of the short sides of the unit pixel UP1 is formed by a short side of the color pixel PX11, a short side of the color pixel PX12 and a short side of the pixel PX13, which extend on the same straight line. The other of the short sides of the unit pixel UP1 is formed by a short side of the color pixel PX14, a short side of the color pixel PX15 and a short side of the pixel PX16, which extend on the same straight line.

In the unit pixel UP1, the pixel electrode PE11 is disposed to correspond to the color pixel PX11, the pixel electrode PE12 is disposed to correspond to the color pixel PX12, the pixel electrode PE13 is disposed to correspond to the color pixel PX13, the pixel electrode PE14 is disposed to correspond to the color pixel PX14, the pixel electrode PE15 is disposed to correspond to the color pixel PX15, and the pixel electrode PE16 is disposed to correspond to the color pixel PX16. The pixel electrode PE11 and pixel electrode PE14 are opposed to the color filter 32R, the pixel electrode PE12 and pixel electrode PE15 are opposed to the color filter 32G, the pixel electrode PE13 is opposed to the color filter 32B, and the pixel electrode PE16 is opposed to the color filter 32W.

One of the short sides of the unit pixel UP2 is formed by a short side of the color pixel PX21, a short side of the color pixel PX22 and a short side of the pixel PX23, which extend on the same straight line. The other of the short sides of the unit pixel UP2 is formed by a short side of the color pixel PX24, a short, side of the color pixel PX25 and a short side of the pixel PX26, which extend on the same straight line.

In the unit pixel UP2, the pixel electrode PE21 is disposed to correspond to the color pixel PX21, the pixel electrode PE22 is disposed to correspond to the color pixel PX22, the pixel electrode PE23 is disposed to correspond to the color pixel PX23, the pixel electrode PE24 is disposed to correspond to the color pixel PX24, the pixel electrode PE25 is disposed to correspond to the color pixel PX25, and the pixel electrode PE26 is disposed to correspond to the color pixel PX26. The pixel electrode PE21 and pixel electrode PE24 are opposed to the color filter 32R, the pixel electrode PE22 and pixel electrode PE25 are opposed to the color filter 32G, the pixel electrode PE23 is opposed to the color filter 32W, and the pixel electrode PE26 is opposed to the color filter 32B.

In this structure, example, too, the same advantageous effects as in the above-described example can be obtained.

Figure 9:
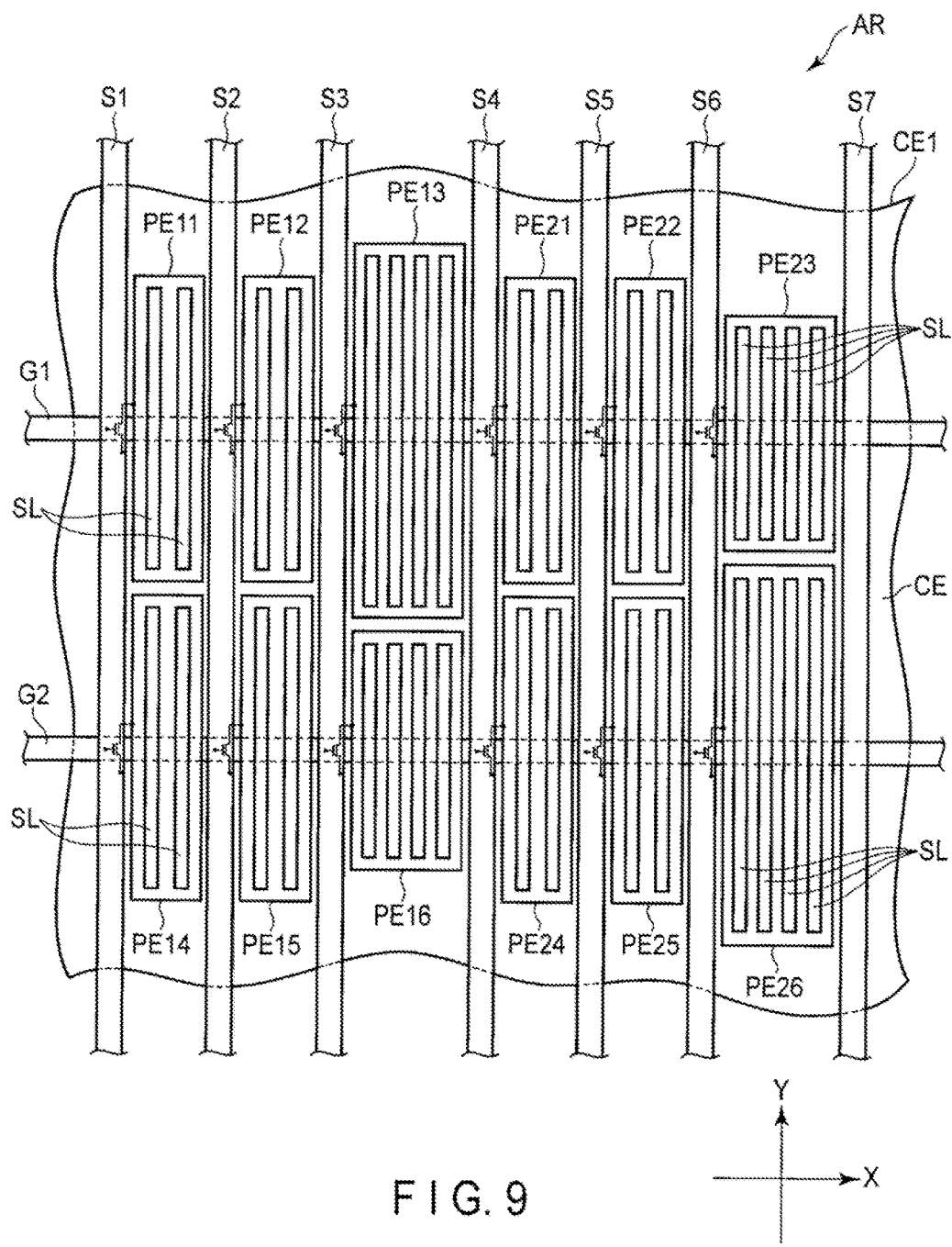
FIG. 9 is a plan view which schematically illustrates another structure example of the array substrate AR which is applicable to the display device of the embodiment.

FIG. 9 is a plan view which schematically illustrates another structure example of the array substrate AR which is applicable to the display device of the embodiment.

The structure example illustrated in FIG. 9 differs from the array substrate AR of FIG. 6 in which the vertical electric field mode is adopted, in that a transverse electric field mode is adopted.

Slits SL are formed in the pixel electrodes PE11 to PE16 and pixel electrodes PE21 to PE26, which overlap the common electrode CE. In the example illustrated, each slit SL is formed in a linear shape extending in the second direction Y, but the shape is not limited to this illustrated example. This array substrate AR can be combined with the counter-substrate including the color filters of the layout shown in FIG. 5. Incidentally, the counter-substrate including the second common electrode CE2 as shown in FIG. 7 is needless.

In this structure example, too, the same advantageous effects as in the above-described example can be obtained.

As has been described above, according to the present embodiment, a display device, which can improve display quality, can be provided.

In the meantime, in the above-described embodiments, the liquid crystal display device has been described as the display device, but the display device may be an organic EL display device. Specifically, instead of using the respective color filters shown in FIG. 5, the respective pixel electrodes shown in FIG. 6 may be replaced with light emission portions of organic EL elements. An organic EL element which emits red light is disposed in the red pixel, an organic EL element which emits green light is disposed in the green pixel, an organic SL element which emits blue light is disposed in the blue pixel, and an organic EL element which emits white light is disposed in the white pixel. In this structure, too, the layout as illustrated in FIG. 5 and FIG. 6 may be adopted. Thereby, the sizes of the blue organic EL element and white organic EL element can be freely set, and the same advantageous effects as in the above-described embodiments can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
an array substrate including a first pixel electrode, a second pixel electrode neighboring the first pixel electrode in a first direction, a third pixel electrode neighboring the second pixel electrode in the first direction, a fourth pixel electrode neighboring the first pixel electrode in a second direction intersecting the first direction, a fifth pixel electrode neighboring the second pixel electrode in the second direction and neighboring the fourth pixel electrode in the first direction, a sixth pixel electrode neighboring the third pixel electrode in the second direction and neighboring the fifth pixel electrode in the first direction, a common electrode opposed to the first to sixth pixel electrodes, and an insulation film between the common electrode and the first to sixth pixel electrodes, wherein
each of the first to sixth pixel electrodes has a plurality of main pixel electrodes and a connecting part connecting the plurality of main pixel electrodes, at least one of the plurality of main pixel electrodes of the third pixel electrode is longer than the plurality of main pixel electrodes of the first and second pixel electrodes in the second direction, at least one of the plurality of main pixel electrodes of the sixth pixel electrode is shorter than the plurality of main pixel electrodes of the fourth and fifth pixel electrodes, the plurality of main pixel electrodes of the first pixel electrode, the plurality of main pixel electrodes of the second pixel electrode, the plurality of main pixel electrodes of the fourth pixel electrode, and the plurality of main pixel electrodes of the fifth pixel electrode have substantially the same length, the connecting part of the first pixel electrode and the connecting part of the second pixel electrode extend on a first straight line, the connecting part of the third pixel electrode extends on a second straight line, the second straight line is shifted in the second direction from the first straight line, the connecting part of the fourth pixel electrode and the connecting part of the fifth pixel electrode extend on a third straight line, the connecting part of the sixth pixel electrode extends on a fourth straight line, the fourth straight line is shifted in the second direction from the third straight line, a number of the plurality of main pixel electrodes of the third pixel electrode is greater than a number of the plurality of main pixel electrodes of the first and the second pixel electrodes, a number of the plurality of main pixel electrodes of the sixth pixel electrode is greater than a number of the plurality of main pixel electrodes of the fourth and the fifth pixel electrode, the number of the plurality of main pixel electrodes of the first pixel electrode, the number of the plurality of main pixel electrodes of the second pixel electrode, the number of the plurality of main pixel electrodes of the fourth pixel electrode and the number of the plurality of main pixel electrodes of the fifth pixel electrode are the same, and the number of the plurality of main pixel electrodes of the third pixel electrode is the same as the number of the plurality of main pixel electrodes of the sixth pixel electrode.

2. The display device of claim 1, wherein
the array substrate further includes a first gate line and a second gate line,
the first gate line is electrically connected to the first to third pixel electrodes,
the second gate line is electrically connected to the fourth to sixth pixel electrodes,
the first gate line crosses central portions of the second direction of the first to third pixel electrodes, respectively, and
the second gate line crosses central portions of the second direction of the fourth to sixth pixel electrodes, respectively.

3. A display device comprising:
a first substrate including a first pixel electrode, a second pixel electrode neighboring the first pixel electrode in a first direction, a third pixel electrode neighboring the second pixel electrode in the first direction, a fourth pixel electrode neighboring the first pixel electrode in a second direction, a fifth pixel electrode neighboring the second pixel electrode in the second direction, a sixth pixel electrode neighboring the third pixel electrode in the second direction, a first common electrode, an interlayer insulation film covering the first common electrode, and a first alignment film covering the first to sixth pixel electrodes;

a second substrate including a first color filter extending in the second direction and opposed to the first pixel electrode and the fourth pixel electrode, a second color filter neighboring the first color filter in the first direction, extending in the second direction and opposed to the second pixel electrode and the fifth pixel electrode, a third color filter neighboring the second color filter in the first direction and opposed to the third pixel electrode, a fourth color filter neighboring the third color filter in the second direction and opposed to the sixth pixel electrode, and a second alignment film; and a liquid crystal layer held between the first substrate and the second substrate, wherein the first to sixth pixel electrodes are formed on the interlayer insulation film and are opposed to the first common electrode, each of the first pixel electrode, the second pixel electrode, the fourth pixel electrode, and the fifth pixel electrode has a first main pixel electrode extending in the second direction, the third pixel electrode has a second main pixel electrode which extends in the second direction and is larger than the first main pixel electrode, and the sixth pixel electrode has a third main pixel electrode which extends in the second direction and is smaller than the first main pixel electrode, the first pixel electrode has a first edge and a second edge, the second pixel electrode has a third edge and a fourth edge, each of the first to fourth edge extends in the first direction, the first edge and the third edge extend on a first straight line, the second edge and the fourth edge extend on a second straight line, and the third pixel electrode has a fifth edge which is displaced in the second direction from the first straight line and a sixth edge which is displaced in the second direction from the second straight line.

* * * * *